United States Patent
Tang

(10) Patent No.: US 7,515,428 B2
(45) Date of Patent: Apr. 7, 2009

(54) DESIGN FOR AUTOMATIC POSITIONING OF POWER SUPPLY MODULE HANDLE

(75) Inventor: Kenneth Tang, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 150 days.

(21) Appl. No.: 11/590,144

(22) Filed: Oct. 31, 2006

(65) Prior Publication Data

US 2008/0101040 A1    May 1, 2008

(51) Int. Cl.
*H05K 7/16* (2006.01)
(52) U.S. Cl. ...................... 361/727; 439/160
(58) Field of Classification Search ................ 361/727, 361/732, 754; 439/157, 159, 160
See application file for complete search history.

(56) References Cited

U.S. PATENT DOCUMENTS

| | | | | |
|---|---|---|---|---|
| 5,600,542 A | * | 2/1997 | Malgouires | 361/732 |
| 5,761,045 A | * | 6/1998 | Olson et al. | 361/726 |
| 6,137,684 A | * | 10/2000 | Ayd et al. | 361/727 |
| 6,222,736 B1 | * | 4/2001 | Sim et al. | 361/727 |
| 6,579,029 B1 | * | 6/2003 | Sevde et al. | 403/322.3 |
| 6,915,562 B2 | * | 7/2005 | Joist et al. | 29/758 |

* cited by examiner

*Primary Examiner*—Hae Moon Hyeon

(57) ABSTRACT

A system for securing a module within a chassis includes a rotatable handle located on the module. The rotatable handle includes a notch and a latch. The chassis includes a cam and guide rail. In embodiments of the invention, the interaction of the notch and the latch on the handle with the cam in the chassis operate to automatically rotate the handle from an open position to a closed position when the module is inserted into the chassis by pushing on a bezel of the module. Embodiments of the invention move the module into a seated position within the chassis when the handle is rotated from an open position to a closed position.

18 Claims, 3 Drawing Sheets

DESIGN FOR AUTOMATIC POSITIONING OF POWER SUPPLY MODULE HANDLE

TECHNICAL FIELD

This application relates in general to components and in specific to components that automatically position the handle of the component.

BACKGROUND OF THE INVENTION

Large scale computer systems, for example, large, multi-processor computer systems, typically use multiple power supplies. These power supplies convert AC power to DC power at voltages useable by the computer system. A power supply module is typically loaded into the chassis of the computer system. The connections are made when the module is seated into the chassis. Prior Art power supplies are typically pushed into position by using the front bezel or the handle. Problems occur if the module is pushed too far into the chassis, for example the module may jam or overshoot. Overshooting is when the module has been placed past its range of position, and the module may become stuck in that position. If the handle is being used once the module becomes stuck, the joint of the handle may break.

BRIEF SUMMARY OF THE INVENTION

The present invention is directed to a system and method which securing a module within a chassis. Embodiment of the invention comprises a rotatable handle, located on the module, that includes a notch and a latch; and at least one feature, located on the chassis, that includes a cam and a guide rail, wherein the cam interacts with the notch to automatically rotate the handle from an open position to a closed position as the module is inserted into the chassis, and cam interacts with the notch and the latch to secure the module within the chassis.

Another embodiment of the invention comprises a rotatable handle, located on the module, that includes a notch and a latch; and at least one feature, located on the chassis, that includes a cam and a guide rail, wherein the latch interacts with the cam to move the module into a seated position within the chassis as the handle is rotated from an open position to a closed position, wherein the notch and the latch interact with the cam to secure the module within the chassis The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Embodiments of the invention are intended to provide a free range of angles of the module handle during insertion of the module for ergonomic improvement, and providing an easy and robust component insertion operation. Embodiments of the invention will reduce damage to the handle during component installation. Embodiments of the invention will also reduce damage to the connection(s) and/or interface(s) between the chassis and the component.

Embodiments of the invention include a dead-stop feature that is located on the front of the system chassis on at least one of the guide rails that is used to load a module into the chassis. The dead-stop feature prevents the module from overshoot, as well as acts a handle closing mechanism, such that if the bezel of the module is used to push the module into the chassis by user, the module handle will self engage with a latch cam tooth of the chassis and rotate closed. The profile of the cam tooth engages with the module at a plurality of different handle positions. The dead-stop feature assists in the alignment of the module during insertion of the module. As the module is inserted into the chassis, the handle rotates up into a closed position. In the closed position, the handle securely locks the module in with the chassis. The module may be a power supply or other component that is insertable into a chassis.

Figure 1:
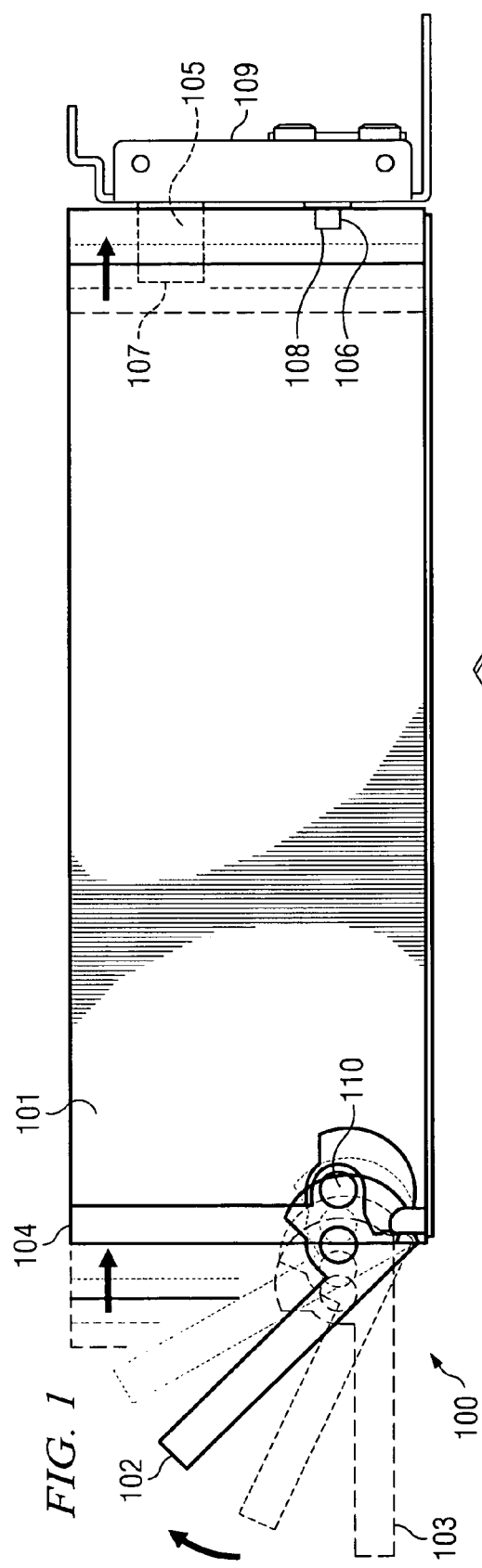
FIG. 1 is a side view of a cut-away of a chassis having a module being inserted therein, according to embodiments of the invention.

FIG. 1 depicts a side cut-away view of a chassis 100 within a module 101 being inserted therein. The module includes handle 102 that is capable of rotating from a fully opened position 103 to the closed position 104 about pivot 110. An open position for the handle 102 is defined herein as the handle 102 being at an angle between the fully opened position 103 and the closed position 104, including the fully opened position 103. Note that this includes a 45 degree angle position of the handle 102, as illustrated in FIG. 1. As the module 101 is inserted into the chassis 100, connectors 107, 108 on the module 101 will couple with connectors 105, 106 on a portion 109 (e.g. a board) of the chassis 100. The connections will provide power, data, etc. between the module 101 and the chassis 100.

Figure 2:
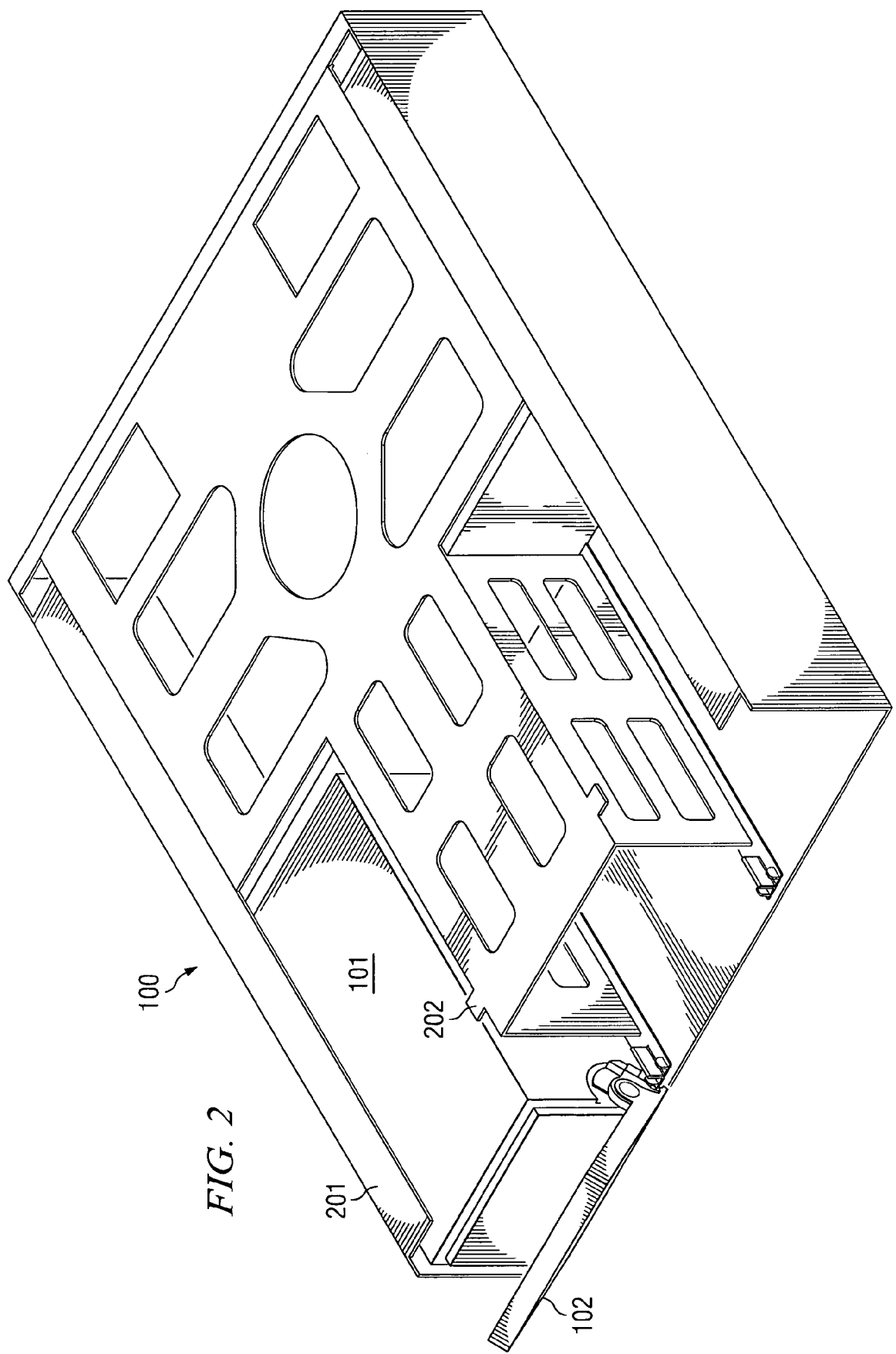
FIG. 2 is a perspective view of a chassis with a module partially inserted therein, according to embodiments of the invention.

FIG. 2 is a perspective view of the chassis 100 with a module 101 partially inserted therein. Note that this chassis 100 depicts bays for three modules 101, however there may be more or fewer module bays. The chassis 100 includes hold down features to prevent vertical movement of the module 101 during insertion, namely flange 201 and tab 202. The flange 201 and the tab 202 may be formed from sheet metal.

The hold down features prevent the module 101 from moving up off of the dead-stop feature during insertion of the module 101.

Figure 3:
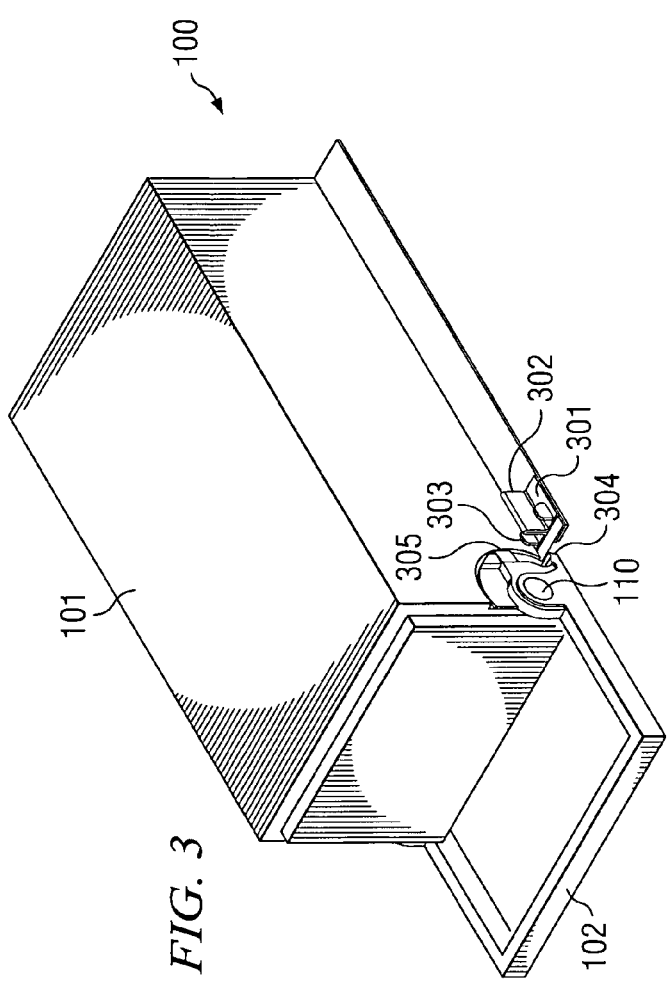
FIG. 3 is a perspective view of a module being inserted into the chassis, according to embodiments of the invention.
Figure 4A:
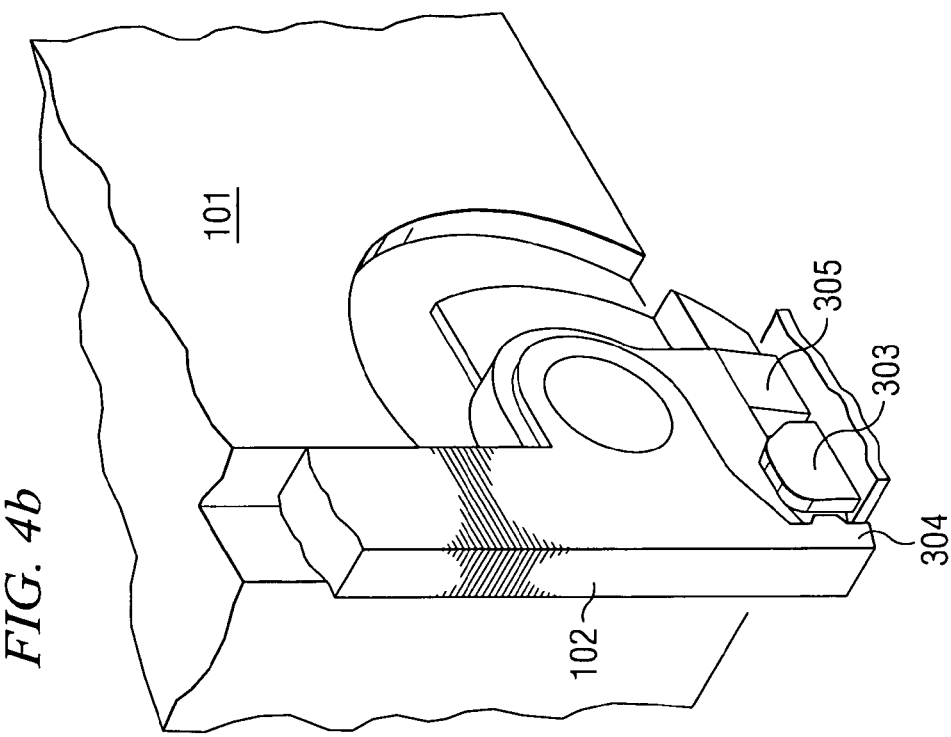
FIGS. 4A and 4B depict a close-up of the module and chassis interface of FIG. 3 with the handle in an open position and the closed position.
Figure 4B:
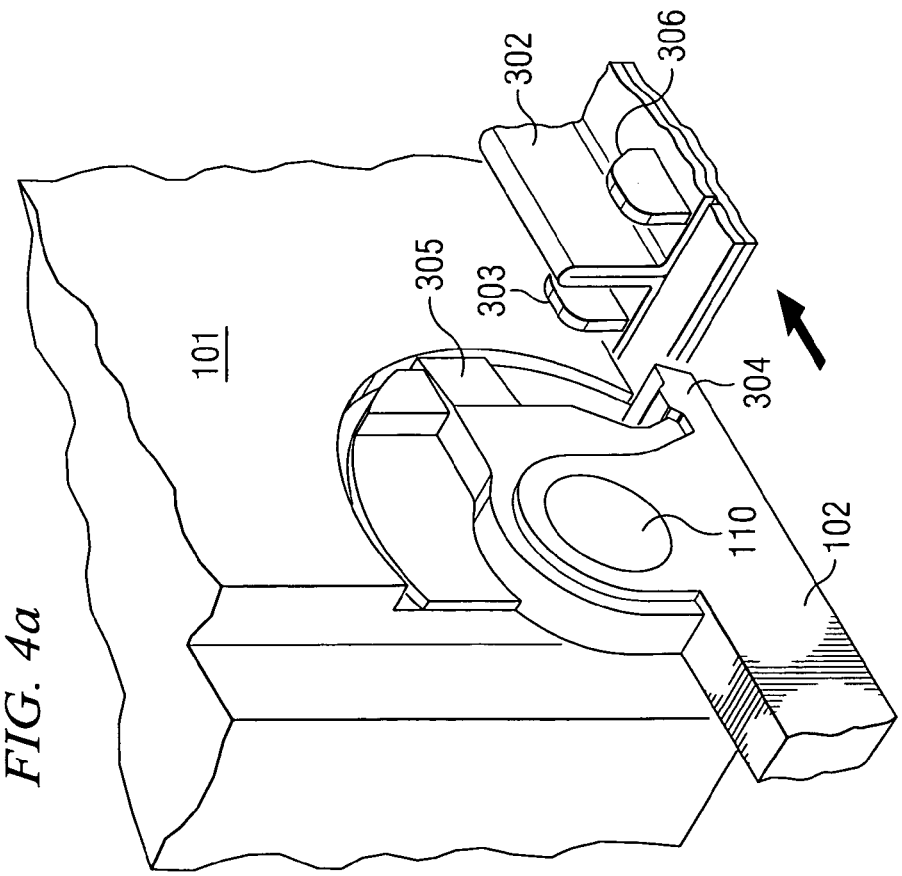

FIG. 3 depicts a perspective view of a module being inserted into the chassis. FIGS. 4A and 4B depicts a close-up of the module and chassis interface of FIG. 3 with the handle in an open position (FIG. 4A) and the closed position (FIG. 4B). The chassis includes dead-stop feature 301 which includes guide rail 302 and cam 303. The dead-stop feature 301 may comprise sheet metal, and guide rail 302 may comprise double-folded sheet metal. The guide rail 302, as well as cam 303, act to guide the module 101 into the proper position within the bay of the chassis. The rail 302 and the cam 303 act to prevent lateral movement of the module. The dead-stop feature 301 interacts with the handle 102, particularly notch 304 and latch 305, to close the handle and lock the module 101 into the chassis 100. The dead-stop feature 301 acts to prevent the module from moving past the connector coupling point or overshoot.

The module may be inserted into the chassis in one of two ways. In the first, the user may push the front of the module 101, which is known as a bezel, until the module is properly seated into the chassis. In this manner, the dead-stop feature 301 and the handle 102 operate to automatically move the handle 102 from an open position to the closed position. As the module is moved into the chassis, the notch 304 engages the cam 303 and rotates the handle 102. When the module is in the seated position, the handle is rotated up, as shown in FIG. 4B. The latch 305 engages a rear portion of the cam 303 to lock the module in place, with the front portion of the cam engaging the notch 304.

The module may also be inserted by using the handle 102. In this manner, the user moves the module into the bay of the chassis until the handle begins to move. The user then moves the handle to the closed position. During this movement, the latch 305 of the handle engages the cam 303, specifically the rear slanted portion 306 of the cam 303. As the handle is moved up, the module is pulled into the chassis by the rotation of the handle. When the handle is in the closed position, the module is properly seated within the chassis. The latch 305 engages a rear portion of the cam 303 to lock the module in place, with the front portion of the cam engaging the notch 304.

Overshoot of the module is prevented by handle engaging the guide rail 302, when the handle is in the closed position.

Note that the direction associated with the terms up, down, left, right, side, front, rear, lateral, vertical, etc. is for descriptive purposes only, as any orientation may be used. For example, the arrangement of FIG. 3 may be rotated in use such that handle 102 is oriented in an up-down manner rather than a left-right manner. As another example, the arrangement of FIG. 3 may be inverted in use such that the handle 102 is rotated down instead of up.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for securing a module within a chassis comprising:
    a rotatable handle, located on the module, that includes a notch and a latch;
    at least one feature, located on the chassis, that includes a cam and a guide rail, wherein the cam interacts with the notch to automatically rotate the handle from an open position to a closed position as the module is inserted into the chassis, and cam interacts with the notch and the latch to secure the module within the chassis with the cam being disposed between the notch and the latch when the handle is in the closed position.

2. The system of claim 1, wherein the module is a power supply.

3. The system of claim 1, wherein the cam and the guide rail are comprised of sheet metal.

4. The system of claim 1, wherein the chassis further includes at least one hold down feature, which reduces vertical movement of the module within the chassis.

5. The system of claim 4, wherein the hold down feature is a tab.

6. The system of claim 5, wherein the tab is comprised of sheet metal.

7. The system of claim 4, wherein the module includes an upper surface, the upper surface including first and second edges where the first edge is generally opposite the second edge and wherein the at least one hold down feature comprises two features, with one feature located adjacent to the first edge of the upper surface of the module and the other located adjacent to the second edge of the upper surface of the module.

8. The system of claim 1, wherein the handle and the feature act to prevent the module overshooting during insertion into the chassis.

9. The system of claim 1, wherein the latch is capable of interacting with the cam to move the module into a seated position within the chassis when the handle is rotated from an open position to a closed position.

10. A system for securing a module within a chassis comprising:
    a rotatable handle, located on the module, that includes a notch and a latch;
    at least one feature, located on the chassis, that includes a cam and a guide rail, wherein the latch interacts with the cam to move the module into a seated position within the chassis as the handle is rotated from an open position to a closed position, wherein the notch and the latch interact with the cam to secure the module within the chassis with the cam being disposed between the notch and the latch when the handle is in the closed position.

11. The system of claim 10, wherein the module is a power supply.

12. The system of claim 10, wherein the cam and the guide rail are comprised of sheet metal.

13. The system of claim 10, wherein the chassis further includes at least one hold down feature, which reduces vertical movement of the module within the chassis.

14. The system of claim 13, wherein the hold down feature is a tab.

15. The system of claim 14, wherein the tab is comprised of sheet metal.

16. The system of claim 13, wherein the module includes an upper surface, the upper surface including first and second edges where the first edge is generally opposite the second edge and wherein the at least one hold down feature comprises two features, with one feature located adjacent to the first edge of the upper surface of the module and the other located adjacent to the second edge of the upper surface of the module.

17. The system of claim 10, wherein the handle and the feature act to prevent the module overshooting during insertion into the chassis.

18. The system of claim 10, wherein the cam is capable of interacting with the notch to automatically rotate the handle from an open position to a closed position when the module is inserted into the chassis by pushing a bezel of the module.

* * * * *